United States Patent
Lilly et al.

(10) Patent No.: US 9,570,695 B2
(45) Date of Patent: Feb. 14, 2017

(54) CARBON MIXTURE OHMIC CONTACT FOR CARBON NANOTUBE TRANSISTOR DEVICES

(71) Applicant: Northrop Grumman Systems Corporation, Falls Church, VA (US)

(72) Inventors: Monica P. Lilly, Frederick, MD (US); Matthew J. Walker, Glen Burnie, MD (US); Wayne S. Miller, Hanover, MD (US); John X. Przybysz, Severna Park, MD (US); Andre E. Berghmans, Woodstock, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/218,274

(22) Filed: Jul. 25, 2016

(65) Prior Publication Data

US 2016/0336524 A1    Nov. 17, 2016

Related U.S. Application Data

(63) Continuation of application No. 14/575,078, filed on Dec. 18, 2014, now Pat. No. 9,401,488.

(51) Int. Cl.
| | |
|---|---|
| *H01L 21/335* | (2006.01) |
| *H01L 21/8238* | (2006.01) |
| *H01L 21/20* | (2006.01) |
| *H01L 29/745* | (2006.01) |
| *H01L 29/74* | (2006.01) |
| *H01L 51/10* | (2006.01) |

(Continued)

(52) U.S. Cl.
CPC ......... *H01L 51/105* (2013.01); *H01L 51/0021* (2013.01); *H01L 51/0048* (2013.01); *H01L 51/0508* (2013.01); *H01L 51/107* (2013.01)

(58) Field of Classification Search
CPC .... H01L 51/057; H01L 51/105; H01L 51/444; H01L 51/5206; B82Y 10/00; B82Y 30/00; B82Y 40/00

(Continued)

(56) References Cited

U.S. PATENT DOCUMENTS

| | | | |
|---|---|---|---|
| 5,523,174 A * | 6/1996 | Tamaki | .......... H05K 1/09 427/436 |
| 6,759,693 B2 | 7/2004 | Vogeli et al. | |

(Continued)

FOREIGN PATENT DOCUMENTS

| | | |
|---|---|---|
| EP | 1973179 | 9/2008 |
| JP | 2003-109974 A | 4/2003 |
| WO | 2011103558 | 8/2011 |

OTHER PUBLICATIONS

International Search Report for PCT Application No. PCT/US2015/058062 dated Feb. 5, 2016.

*Primary Examiner* — Hsien Ming Lee
(74) *Attorney, Agent, or Firm* — Sean S. Wooden; Andrews Kurth Kenyon LLP

(57) ABSTRACT

A cobalt-carbon (Co—C) eutectic metal alloy ohmic contact for a radio-frequency (RF) carbon nanotube (CNT) field effect transistor (FET) device and a method of manufacturing same are disclosed. Embodiments of a method include providing a graphite crucible, placing Co and a C source within the graphite crucible, heating the graphite crucible containing the Co and C source such that the Co and C source combine with graphite from the graphite crucible to thereby form a Co—C eutectic metal alloy, and creating an ohmic contact by depositing the Co—C eutectic metal alloy directly on top surfaces of CNTs of a RF CNT FET device such that the Co—C eutectic metal alloy is in direct contact with the CNTs. The Co—C eutectic metal alloy ohmic contact formed in this manner is consistently stabile and (Continued)

uniform and functions as a high work function layer that also serves as an adhesion layer to the CNTs.

16 Claims, 2 Drawing Sheets

(51) Int. Cl.
  *H01L 51/00* (2006.01)
  *H01L 51/05* (2006.01)
(58) Field of Classification Search
  USPC ....... 257/213, 220, 226, 229, 255, 262, 263, 257/274, 337; 438/142, 149, 199–203, 438/279, 478, 584
  See application file for complete search history.

(56) References Cited

U.S. PATENT DOCUMENTS

| | | | |
|---|---|---|---|
| 7,264,990 B2 | 9/2007 | Rueckes et al. | |
| 7,535,016 B2 | 5/2009 | Furukawa et al. | |
| 7,692,238 B2 | 4/2010 | Nihei | |
| 7,755,115 B2 | 7/2010 | Awano | |
| 7,846,819 B2 | 12/2010 | Pribat et al. | |
| 7,960,713 B2 | 6/2011 | Hunt et al. | |
| 7,977,761 B2 | 7/2011 | Kabir | |
| 8,183,659 B2 | 5/2012 | Kabir | |
| 8,222,127 B2 | 7/2012 | Marsh et al. | |
| 8,362,525 B2 * | 1/2013 | Bertin | B82Y 10/00 257/213 |
| 8,860,137 B2 * | 10/2014 | Zhou | H01L 29/775 257/347 |
| 2003/0211724 A1 | 11/2003 | Haase | |
| 2008/0176058 A1 | 7/2008 | Maschmann et al. | |
| 2008/0293228 A1 | 11/2008 | Kalburge | |
| 2009/0184311 A1 | 7/2009 | Steinberg | |
| 2009/0224230 A1 | 9/2009 | Pesetski et al. | |
| 2009/0278556 A1 | 11/2009 | Man et al. | |
| 2010/0108988 A1 | 5/2010 | Grebel et al. | |
| 2010/0140591 A1 | 6/2010 | Nicholas et al. | |
| 2010/0140600 A1 | 6/2010 | Clough et al. | |
| 2011/0114914 A1 | 5/2011 | Numata et al. | |

* cited by examiner

CARBON MIXTURE OHMIC CONTACT FOR CARBON NANOTUBE TRANSISTOR DEVICES

RELATED APPLICATIONS

This application is a continuation of U.S. application Ser. No. 14/575,078, entitled "Cobalt-Carbon Eutectic Metal Alloy Ohmic Contact for Carbon Nanotube Field Effect Transistors," filed Dec. 18, 2014 and issued Jul. 26, 2016 as U.S. Pat. No. 9,401,488, which is hereby incorporated by reference, in its entirety.

FIELD

Embodiments are in the technical field of field effect transistors (FETs), particularly carbon nanotube (CNT) FETs. More particularly, embodiments disclosed herein relate to cobalt-carbon (Co—C) eutectic metal alloy ohmic contacts for CNT FETs devices and methods for making same which, inter alia, fosters improved radio frequency (RF) performance of FETs.

BACKGROUND

In the push to scale CNT FET electronics from long channel optical lithography to short channel deep ultraviolet (DUV) lithography of 0.5 microns, the device contact length needs to be reduced to less than 1 micron. In the state of the art CNT FET, a thin adhesion layer of titanium (Ti) is capped with palladium (Pd) metal as an ohmic contact to a CNT array. This Ti layer is necessary for adhesion of the Pd to the CNTs, but the Ti layer has a lower work function then the CNT array, thus resulting in a barrier at each contact point. In the state of the art, it has been shown that the Ti layer hinders channel scaling of less than 1 micron. If the Ti layer is removed from the stack, channel scaling of less than 1 micron can be measured but the lack of adhesion between the Pd and the CNT array (e.g., on quartz) results in a yield of less than 10%.

A Co—C eutectic metal alloy as a ohmic contact fixes both of these problems. A Co—C eutectic metal alloy adheres to the wafer without a need for an adhesion layer. In contrast to the use of the high work function metal Pd, the use of a Co—C eutectic metal alloy comprising the high work function metal Co allows the Co—C eutectic metal alloy to be in direct contact with the CNTs and thus reduce the barrier on the contact. Thus, the Co—C eutectic metal alloy enables contact scaling of less than 1 micron with great adhesion resulting in yields above 75%.

While the work function of Co has been catalogued, it has not been applied to CNT FET's as an ohmic contact or part of the composition of an ohmic contact due to the difficulty in integrating the process. In embodiments herein, Co—C eutectic metal alloy ohmic contacts utilize the solubility of C into Co as a way to stabilize the deposition technique allowing for easy integration via electron beam evaporation.

SUMMARY

Embodiments are directed to a method for depositing a cobalt-carbon (Co—C) eutectic metal alloy as an ohmic contact for a radio-frequency (RF) carbon nanotube (CNT) field effect transistor (FET) device comprising: providing a graphite crucible; placing Co and a C source within the graphite crucible; heating the graphite crucible containing the Co and C source such that the Co and C source combine with graphite from the graphite crucible to thereby form a Co—C eutectic metal alloy; and creating an ohmic contact by depositing the Co—C eutectic metal alloy directly on top surfaces of CNTs of a RF CNT FET device such that the Co—C eutectic metal alloy is in direct contact with the CNTs.

In an embodiment, the depositing of the Co—C eutectic metal alloy is performed using electron beam evaporation.

In an embodiment, the C source may be graphite. The placing of the Co and graphite within the graphite crucible prior to the heating results in a ratio of Co to graphite of approximately 88:12.

In an embodiment, the deposited Co—C eutectic metal alloy may be within a range of 30-150 Å in height.

Embodiments are also directed to a Co—C eutectic metal alloy ohmic contact for a RF CNT FET device manufactured by the method above.

Embodiments are further directed to a RF CNT FET device. The RF CNT FET device comprises a plurality of CNTs, wherein the CNTs have top surfaces. The RF CNT FET device also comprises an ohmic contact deposited directly on the top surfaces of the CNTs such that the ohmic contact is in direct contact with the CNTs, wherein the ohmic contact comprises a Co—C eutectic metal alloy.

In an embodiment, the ohmic contact consists of Co and C.

In an embodiment, the deposited Co—C eutectic metal alloy may be within a range of 30-150 Å in height.

In an embodiment, the RF CNT FET device may further comprise a resistivity layer deposited directly on a top surface of the ohmic contact. The resistivity layer may comprise palladium (Pd). The RF CNT FET device may further comprise a scratch resistant layer deposited directly on a top surface of the resistivity layer. The scratch resistant layer may comprise platinum (Pt).

BRIEF DESCRIPTION OF THE DRAWINGS

The detailed description will refer to the following drawings in which like numerals refer to like items, and in which.

DETAILED DESCRIPTION

Figure 1:
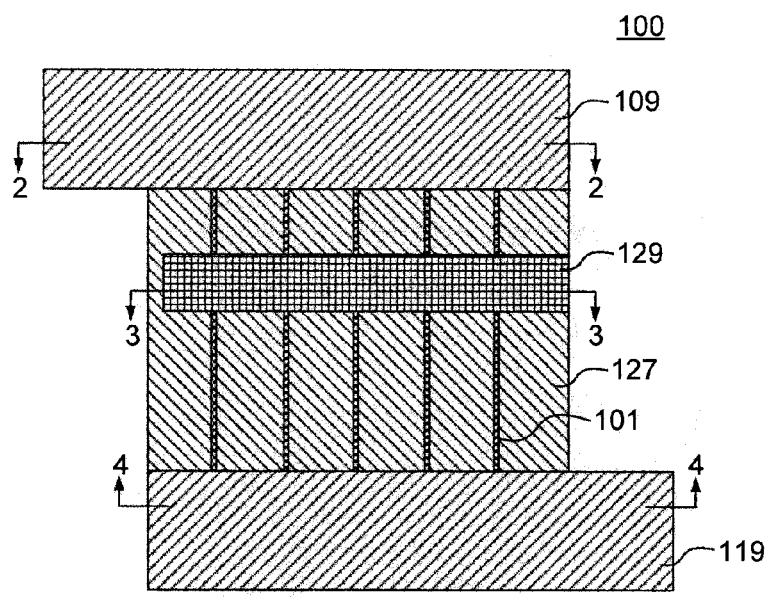
FIG. 1 is a plan view of an embodiment of a RF CNT FET device.

It is to be understood that the figures and descriptions of the present invention may have been simplified to illustrate elements that are relevant for a clear understanding of the present invention, while eliminating, for purposes of clarity, other elements found in a typical RF CNT FET or typical method for making a RF CNT FET. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will now be made to the drawings wherein like structures are provided with like reference designations.

Contact to RF CNTs is dependent on the ability to deposit a metal with a high work function to match the band structure of the array of CNTs. In embodiments disclosed herein, the evaporation of a Co—C eutectic metal alloy in a graphite crucible is used in the method for making an ohmic contact for RF CNT FET's. The ability to deposit the Co—C eutectic metal alloy is based on the use of a graphite crucible and is achieved via incorporation of C (e.g., graphite) in the Co source to be placed in the graphite crucible from small amounts up to the eutectic weight percent of Co Carbide to improve contacts.

The initial test for CNT contacts is to determine for a known CNT array the current per tube that is obtained from a two terminal ID-VD measurement at 1 Volt. Next, a scanning electron microscope (SEM) is used on the CNT array to determine the number of tubes present in the CNT array. In an embodiment, a CNT FET utilizing a Co—C eutectic metal alloy/Pd/Pt ohmic contact stack exhibits a current per tube of 3-4 micro amps per CNT. Whereas, a state of the art CNT FET utilizing a Ti/PD/Pt ohmic contact stack exhibits a current per tube of 4-5 micro amps per CNT. Next, CNT FETs were fabricated to the gate to check channel scaling. For the CNT FET utilizing a Co—C eutectic metal alloy/Pd/Pt ohmic contact stack, channel scaling is achieved for at least the characteristics from 8 microns to 2 microns. The CNT FET utilizing a Co—C eutectic metal alloy/Pd/Pt ohmic contact stack enables a CNT FET to be fabricated through the gate with Source—Drain spacing of less than 1 micron.

CNT arrays are prepared/patterned for source and drain electrode deposition. Co source is either pre-mixed with a C source before placing the pre-mix in a graphite crucible, or the Co is mixed with C within the graphite crucible for in-situ mixing.

The composition of the crucible is graphite. When a source of Co placed within the crucible is melted, the Co source absorbs some of the graphite from the crucible. However, to achieve a clean reaction having uniformity in the melt, it is necessary to additionally utilize graphite in the source placed within the crucible. With Co alone, over a period of time, thin films produced would having undesirably inconsistent compositions depending on the age of the Co source. Graphite, therefore, is necessary for reproducibility, stability, and uniformity purposes. Thus, a premixture source containing Co and C such as graphite achieves a consistently stable and uniform meld as compared to using a source consisting of only Co.

Co in the form of, for example, chunks or pellets, and graphite powder is added to the graphite crucible. The crucible and mixture therein are heated at a temperature in a range of approximately 1600° C.-1700° C. for a period of at least approximately 3 hours. During the melting process, the Co is reacted with C from the crucible. The melting process results in the Co and graphite from the premixture, along with graphite from the crucible, being melded together to form a Co—C eutectic metal alloy.

The crucible containing the Co—C eutectic metal alloy is allowed to cool into a solid source and is then loaded into an electron beam evaporation machine. The Co—C eutectic metal alloy is hit with an electron beam to locally melt sections of the Co—C eutectic metal alloy to vaporize it. The vapor will then rise up and condense onto a semiconductor wafer as a thin film having the Co—C eutectic metal alloy composition. The deposited thin film Co—C eutectic metal alloy serves as an adhesion layer and works as a high work-function match (i.e. dominant to carry holes).

In one exemplary embodiment, the method utilizes a crucible consisting of graphite having a volume of 7 cc and the premixed Co:graphite ratio that is initially added to the pre-melted crucible is approximately 88:12.

Other high work-function elements such as Pd in place of (or in addition to) Co in the above process were attempted. But in practice, use of these other high work-function materials required a separate adhesion layer to adhere the metal to the CNTs. As such, Co is required as the high work-function element in the above process.

The Co—C eutectic metal alloy is deposited on the CNTs in a thickness/height in a range of approximately 30-150 Å, with a preferred thickness of 100 Å. As a result, the thin film of the deposited Co—C eutectic metal alloy reduces stress. A resistivity layer such as Pd is then deposited on the top surface of the Co—C eutectic metal alloy in a thickness in a range of 50-100 nm, with a preferred thickness of 50 nm. The Pd layer ensures a diffusion barrier for later processing steps and to create a stack conducive to good ohmic contact with the CNTs. Next, a scratch resistant layer such as Pt is then deposited on the top surface of the Pd layer in a thickness in a range of 20-50 nm, with a preferred thickness of 20 nm. The FET is finished through the gate dielectric using gate lithography in order to result in a 3-terminal measurement of superior ID-VD and ID-VG characteristics.

In prior art CNT FETs, Pd was used as the high work function layer, but it required Ti as an adhesion layer to the CNTs. However, for the Pd to provide the work function required, the Ti layer needed to be extremely thin, i.e., on the order of 15 Å, leading to unreliable formation of the Ti layer in the electron beam deposition process. In the embodiments described herein, the single Co—C eutectic metal alloy layer replaces both the Ti layer functioning as the adhesion layer and the Pd layer functioning as the high work function layer, although Pd is still utilized as a resistivity layer deposited on the Co—C eutectic metal alloy layer for resistivity purposes, as mentioned above.

Figure 2:
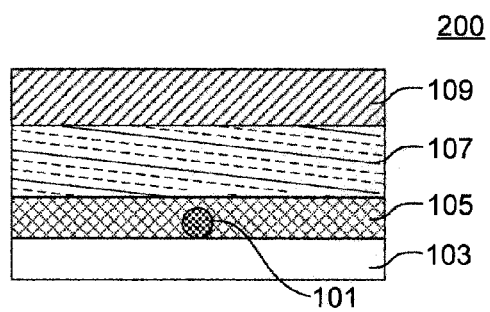
FIG. 2 is a cross-sectional side view of a source portion of the RF CNT FET device taken along line 2-2 shown in FIG. 1.

With reference to FIG. 1, shown is a plan view of an embodiment of a RF CNT FET device 100. With reference to FIG. 2, shown is a cross-sectional side view of a source portion 200 of the RF CNT FET taken along line 2-2 shown in FIG. 1. The RF CNT FET device 100 comprises a plurality of CNTs 101, wherein the CNTs 101 have top surfaces. The RF CNT FET device 100 also comprises an ohmic contact 105 deposited on a top surface of a substrate 103 and deposited directly on the top surfaces of the CNTs 101 such that the ohmic contact 105 is in direct contact with the CNTs 101, wherein the ohmic contact 105 comprises a Co—C eutectic metal alloy.

In an embodiment, the ohmic contact 105 consists of Co and C.

In an embodiment, the deposited Co—C eutectic metal alloy may be within a range of 30-150 Å in height.

In an embodiment, the RF CNT FET device 100 may further comprise a resistivity layer 107 deposited directly on a top surface of the ohmic contact 105. The resistivity layer 107 may comprise Pd. The RF CNT FET device 100 may further comprise a scratch resistant layer 109 deposited directly on a top surface of the resistivity layer 107. The scratch resistant layer 109 may comprise Pt.

Figure 3:
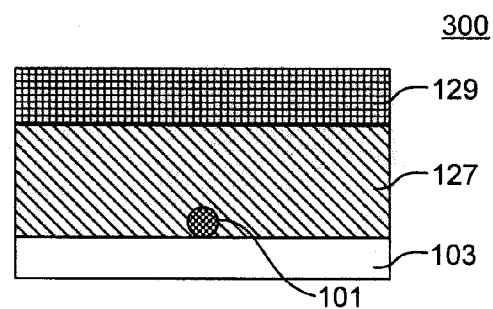
FIG. 3 is a cross-sectional side view of a gate portion of the RF CNT FET device taken along line 3-3 shown in FIG. 1.

With reference to FIG. 3, shown is a cross-sectional side view of a gate portion 300 of the RF CNT FET taken along line 3-3 shown in FIG. 1. A dielectric layer 127 is deposited on the CNTs 101 and the top surface of the substrate 103, and a gate layer 129 is deposited on a top surface of the dielectric layer 127.

Figure 4:
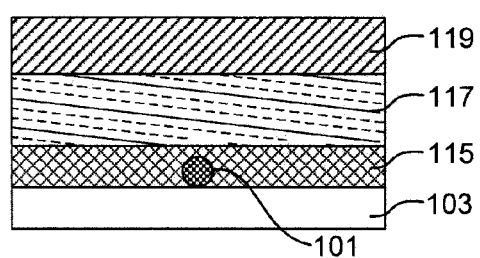
FIG. 4 is a cross-sectional side view of a drain portion of the RF CNT FET device taken along line 4-4 shown in FIG. 1.

With reference to FIG. 4, shown is a cross-sectional side view of a drain portion 400 of the RF CNT FET taken along line 4-4 shown in FIG. 1. The RF CNT FET device 100 also comprises an ohmic contact 115 deposited on a top surface of a substrate 103 and deposited directly on the top surfaces of the CNTs 101 such that the ohmic contact 115 is in direct contact with the CNTs 101, wherein the ohmic contact 115 comprises a Co—C eutectic metal alloy.

In an embodiment, the ohmic contact 115 consists of Co and C.

In an embodiment, the deposited Co—C eutectic metal alloy may be within a range of 30-150 Å in height.

In an embodiment, the RF CNT FET device 100 may further comprise a resistivity layer 117 deposited directly on a top surface of the ohmic contact 115. The resistivity layer 117 may comprise Pd. The RF CNT FET device 100 may further comprise a scratch resistant layer 119 deposited directly on a top surface of the resistivity layer 117. The scratch resistant layer 119 may comprise Pt.

Figure 5:
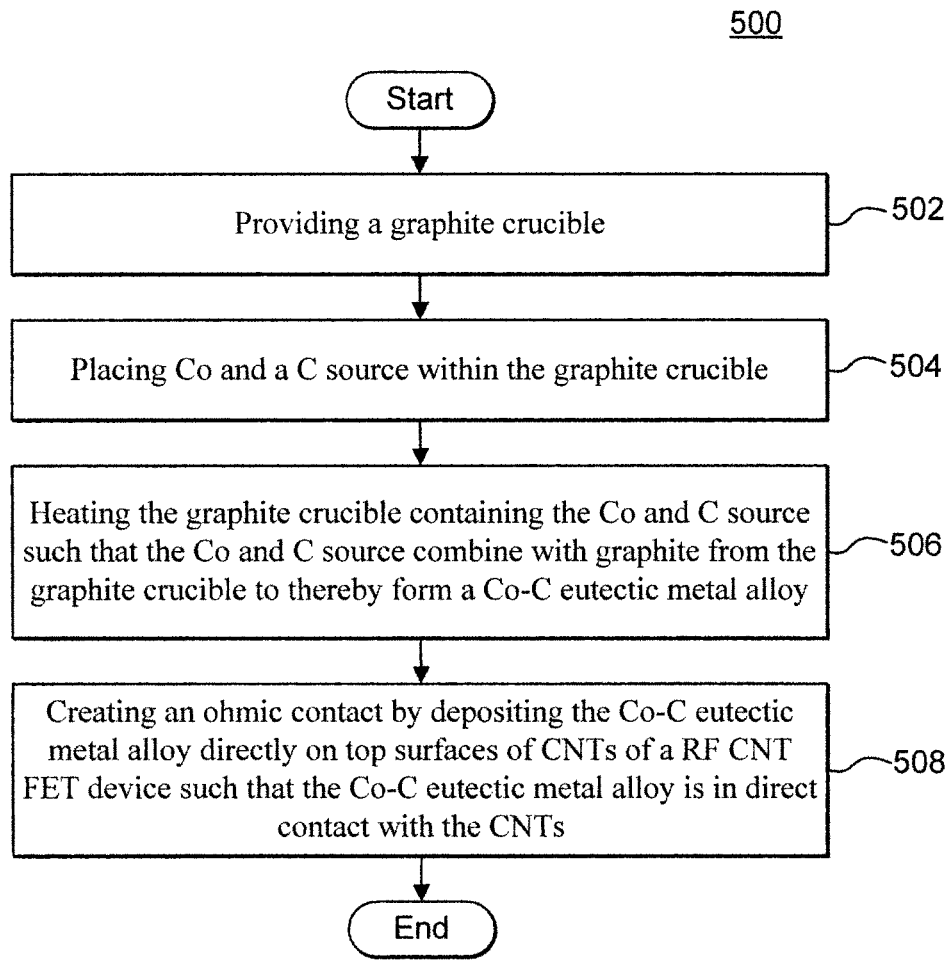
FIG. 5 is a flowchart illustrating an embodiment of a method for depositing a Co—C eutectic metal alloy as an ohmic contact for a RF CNT FET device.

With reference to FIG. 5, shown is a flowchart illustrating an embodiment of a method 500 for depositing a Co—C eutectic metal alloy as an ohmic contact for a RF CNT FET device. Embodiments are directed to a method 500 for depositing a Co—C eutectic metal alloy as an ohmic contact for a RF CNT FET device comprising: providing a graphite crucible (block 502); placing Co and a C source within the graphite crucible (block 504); heating the graphite crucible containing the Co and C source such that the Co and C source combine with graphite from the graphite crucible to thereby form a Co—C eutectic metal alloy (block 506); and creating an ohmic contact by depositing the Co—C eutectic metal alloy directly on top surfaces of CNTs of a RF CNT FET device such that the Co—C eutectic metal alloy is in direct contact with the CNTs (block 508).

In an embodiment, the depositing of the Co—C eutectic metal alloy is performed using electron beam evaporation.

In an embodiment, the C source may be graphite. The placing of the Co and graphite within the graphite crucible prior to the heating results in a ratio of Co to graphite of approximately 88:12.

In an embodiment, the deposited Co—C eutectic metal alloy may be within a range of 30-150 Å in height.

Embodiments are also directed to a Co—C eutectic metal alloy ohmic contact for a RF CNT FET device manufactured by the method above.

For simplicity purposes, it is noted that the elements illustrated in FIGS. 1-4 are not drawn to scale.

Embodiments disclosed herein utilizing Co—C eutectic metal alloy ohmic contacts for CNT FETs devices and methods for making same fosters improved RF performance of FETs.

The contemplated modifications and variations specifically mentioned above are considered to be within the spirit and scope of the present invention.

Those of ordinary skill in the art will recognize that various modifications and variations may be made to the embodiments described above without departing from the spirit and scope of the present invention. It is therefore to be understood that the present invention is not limited to the particular embodiments disclosed above, but it is intended to cover such modifications and variations as defined by the following claims.

The invention claimed is:

1. A carbon nanotube (CNT) transistor device comprising:
    a plurality of CNTs of a transistor device, wherein the CNTs have top surfaces; and
    an ohmic contact deposited directly on the top surfaces of the CNTs such that the ohmic contact is in direct contact with the CNTs, wherein the ohmic contact has a top surface; and
    a resistivity layer deposited on the top surface of the ohmic contact,
    wherein the ohmic contact comprises a cobalt-carbon mixture that serves as an adhesion layer.

2. The CNT transistor device of claim 1 wherein the volume ratio of Co to C is approximately 88:12.

3. The CNT transistor device of claim 1 wherein the Co—C mixture is an eutectic metal alloy.

4. The CNT transistor device of claim 1 wherein the deposited Co—C mixture is within a range of 30-150 Å in thickness.

5. The CNT transistor device of claim 1 wherein the deposited Co—C mixture is approximately 100 Å in thickness.

6. The CNT transistor device of claim 1 wherein the resistivity layer comprises palladium (Pd).

7. The CNT transistor device of claim 1 wherein the resistivity layer is within a range of 50-100 nm in thickness.

8. The CNT transistor device of claim 1 further comprising a scratch resistant layer deposited directly on a top surface of the resistivity layer.

9. The CNT transistor device of claim 8 wherein the scratch resistant layer comprises platinum (Pt).

10. The CNT transistor device of claim 8 wherein the scratch resistant layer is within a range of 20-50 nm in thickness.

11. The CNT transistor device of claim 1 wherein the CNT transistor device is a radio-frequency CNT field effect transistor.

12. A method for depositing a cobalt-carbon mixture as an ohmic contact, the method comprising:
    providing a graphite crucible;
    placing cobalt and a C source within the graphite crucible;
    heating the graphite crucible containing the cobalt and C source such that the cobalt and C source combine with graphite from the graphite crucible to thereby form a cobalt-C mixture; and
    creating an ohmic contact by depositing the cobalt-C mixture directly on top surfaces of carbon nanotubes (CNTs) of a CNT transistor device such that the cobalt-C mixture is in direct contact with the CNTs that serves as an adhesion layer.

13. The method of claim 12 wherein the depositing the Co—C mixture is performed using electron beam evaporation.

14. The method of claim 12 wherein the C source is graphite.

15. The method of claim 12 wherein the placing the Co and graphite within the graphite crucible occurs prior to the heating and results in a volume ratio of Co to graphite of approximately 88:12.

16. The method of claim 12 wherein the CNT transistor device is a radio-frequency CNT field effect transistor.

* * * * *